(12) United States Patent
Yoshinaga

(10) Patent No.: US 6,750,800 B2
(45) Date of Patent: Jun. 15, 2004

(54) ANALOG-DIGITAL CONVERTER AND METHOD FOR CONVERTING DATA OF THE SAME

(75) Inventor: Chikashi Yoshinaga, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/374,342

(22) Filed: Feb. 26, 2003

(65) Prior Publication Data

US 2003/0160714 A1 Aug. 28, 2003

(30) Foreign Application Priority Data

Feb. 27, 2002 (JP) .......................................... 2002-050998

(51) Int. Cl.[7] .............................................. H03M 1/12
(52) U.S. Cl. ........................ 341/172; 341/155; 341/118; 341/120
(58) Field of Search ................................ 341/118, 120, 341/122, 168, 172, 162

(56) References Cited

U.S. PATENT DOCUMENTS

| 3,742,200 | A | * | 6/1973 | Marley ........................ 341/122 |
| 4,908,620 | A | * | 3/1990 | Fujisawa ..................... 341/172 |
| 5,581,252 | A | | 12/1996 | Thomas |
| 5,617,093 | A | * | 4/1997 | Klein .......................... 341/172 |
| 5,686,918 | A | | 11/1997 | Uda |
| 5,703,589 | A | * | 12/1997 | Kalthoff et al. .............. 341/172 |
| 5,729,232 | A | * | 3/1998 | Fujimori ...................... 341/172 |
| 5,841,310 | A | * | 11/1998 | Kalthoff et al. ............. 341/172 |
| 6,144,331 | A | | 11/2000 | Jiang |
| 6,181,269 | B1 | | 1/2001 | Nishiuchi et al. |
| 6,229,472 | B1 | | 5/2001 | Nishida |
| 6,411,244 | B1 | * | 6/2002 | Dobos et al. ................ 341/122 |
| 6,515,612 | B1 | * | 2/2003 | Abel ........................... 341/172 |
| 6,653,967 | B2 | * | 11/2003 | Hamashita .................. 341/172 |

FOREIGN PATENT DOCUMENTS

| EP | 0 797 305 | 9/1997 |
| EP | 1 039 642 | 9/2000 |
| JP | 63-004719 | 1/1988 |
| JP | 4-007914 | 1/1992 |
| JP | 7-33033 | 6/1995 |
| JP | 2000-338159 | 12/2000 |

OTHER PUBLICATIONS

Ogawa, et al., "A Switched–Capacitor Successive–Approximation A/D Converter" IEEE Transactions on Instrumentation and Measurement vol. 42, No. 4; Aug. 1, 1993, pp. 847–853: XP000399902: ISSN: 0018–9456.

* cited by examiner

Primary Examiner—Michael Tokar
Assistant Examiner—Lam T. Mai
(74) Attorney, Agent, or Firm—Katten Muchin Zavis Rosenman

(57) ABSTRACT

An analog-digital converter has a sampling capacitor in which a voltage of an analog input terminal is sampled, and a digital-analog converter for performing an electric discharge of a residual voltage of the sampling capacitor at a timing prior or subsequent to an analog-digital conversion.

17 Claims, 11 Drawing Sheets

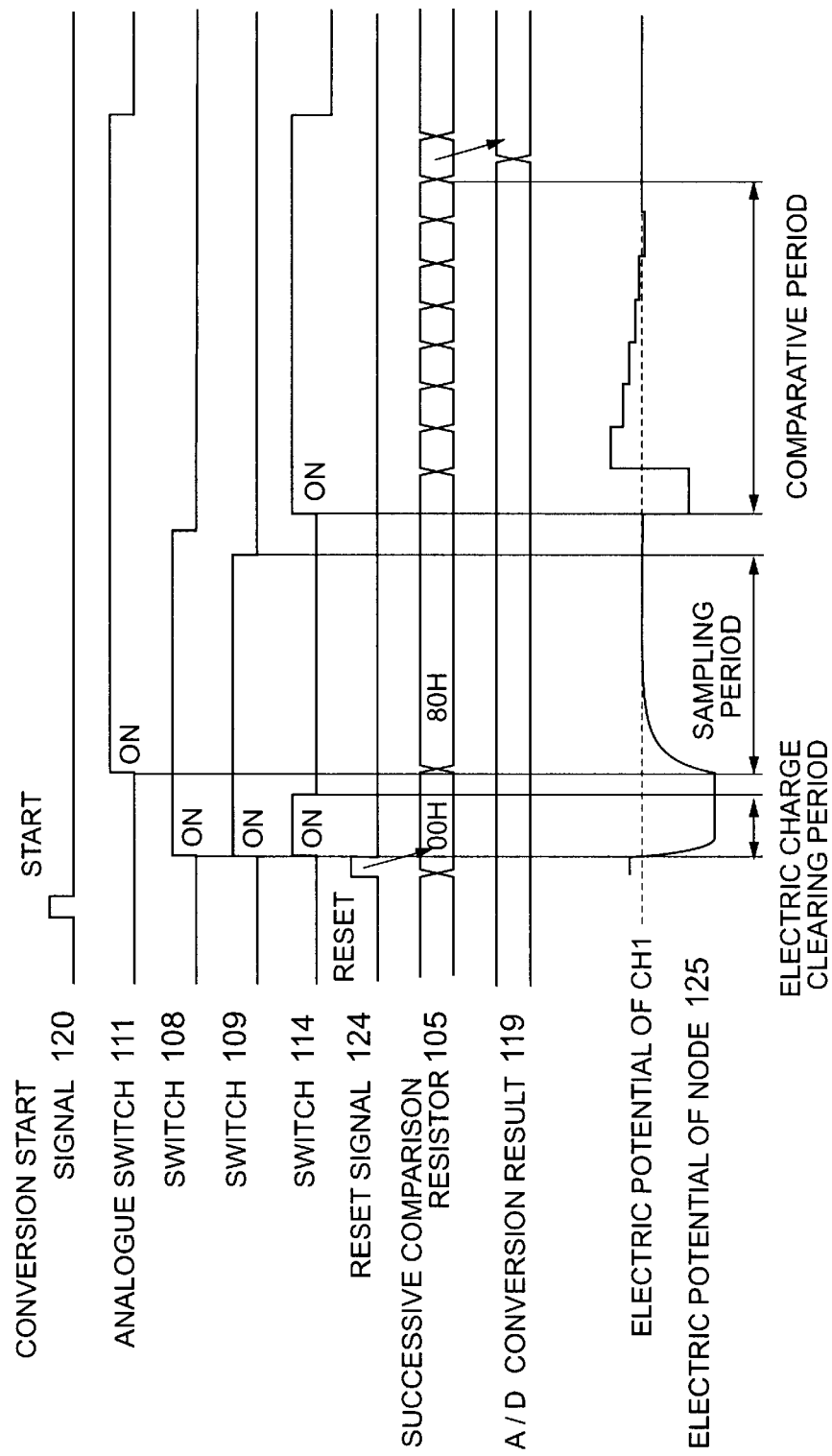

ANALOG-DIGITAL CONVERTER AND METHOD FOR CONVERTING DATA OF THE SAME

BACKGROUND OF THE INVENTION

1. Field of the Invention

The present invention relates to an analog-digital converter and a method for converting a data of the same and, particularly, to an analog-digital converter which eliminates an adverse effect caused by a residual electric charge of a sampling capacitor which the analog-digital converter comprises, and a method for converting a data of the same.

2. Description of the Prior Art

In recent years, information processors based on a digital technique have come into heavy usage in society at large. On the other hand, equipment such as sensors and the like has been utilizing analogue voltage values. To utilize such analogue values in the information processors based on the digital technique, analogue-digital converters are required. The conversion of such analogue values into digital values is frequently performed by the analog-digital converters (hereinafter, abbreviated as [A/D converter]). Moreover, various controllers for performing the processing subsequent to the analogue-digital conversion are also well known.

In general, the controllers such as those described above comprise a plurality of analogue input terminals, a channel selector portion which is provided in the input portion of the A/D converter and selects one analogue input terminal from among a plurality of analogue input terminals, and a sampling capacitor which holds a voltage of the selected analogue input terminal until an A/D converting operation is completed.

In the case where such an A/D converter is built into some device and an open-failure occurs due to some reason while the device is actually used, since the A/D converter is not provided with an discharge circuit, the voltage of the channel which is A/D converted is put into a state of being held in the sampling capacitor at a point of the time before the failure occurs.

In this case, since the residual voltage of the sampling capacitor is A/D converted and the A/D converted voltage is outputted as an erroneously converted value, this will sometimes cause a malfunction of the device having the built-in A/D converter.

As a counter measure to cope with such a problem, though it is contemplated to add a discharge switching circuit to the outside of the device, this will create a new problem of the complication of the device structure and the cost-up thereof.

Further, as another counter measure, a method is contemplated in which a constant voltage is applied to each of the analogue input terminals through a high resistance, and a discharge is made at the constant voltage when the open failure occurs.

However, since this method uses the high resistance, the time constant of the discharge circuit becomes high, and a considerable amount of time is required from the occurrence of the open failure to the completion of the discharge. For this reason, during this time, if an erroneous conversion value is loaded, it ends up with the same state where no counter measure has been taken, thereby causing a malfunction of the device.

On the other hand, if the discharge circuit is not set to the high resistance, a margin of error due to potential voltages with sensors or signal sources becomes high, thereby creating a problem in the degree of accuracy.

For this reason, as means for solving such problems, there have been proposed various means. For example, the analogue digital-converter, which solves such problems, is described in Japanese Utility Model Laid-Open No. 7-33033.

Shown in FIG. 1 is a structure of this analogue-digital converter. Referring to FIG. 1, this analogue-digital converter comprises an analog-digital conversion portion 901; a channel selection portion 902 comprising a plurality of channels CH1 (909), CH2 (910) to CHn and switches 906, 907, 908 connected to each channel CH1 to CHn; a switch 905 connected in series to each switch 906, 907, 908 and connected in series to the analogue-converting portion 901; and a sampling capacitor 904 extended between the switch 905 and the ground.

In this analog-digital converter, one channel CHn of the channel selection portion 902 is connected to the ground as a discharge channel, and prior to the A/D conversion in other channels, the discharge channel CHn is selected to discharge the residual voltage of the sampling capacitor 904.

Further, a sample and hold circuit as shown in FIG. 2 has been described in Japanese Patent Laid-Open No. 4-7914.

This sample and hold circuit comprises a plurality of channels CH1 (1009), CH2 (1010) to CHn (1011); a channel selection portion 1002 comprising switches 1006, 1007, 1008 which are connected in series to each channel CH1 to CHn;

a switch 1005 connected in series to each switch 1006, 1007, 1008 and also to an output terminal 1001; a sampling capacitor 1004 extended between the switch 1005 and the ground; a charging and discharging circuit 1013 connected to a node between the switch 1005 and the output terminal 1001; and a switch 1012 provided between the node and the charging and discharging circuit 1013.

In this sample and hold circuit, the sampling capacitor 1004 is added with the charging and discharging circuit 1013 and, prior to the sampling period of time, the sampling capacitor 1004 is initialized to a predetermined voltage by the charging and discharging circuit 1013 so as to eliminate the influences from the channels which were previously A/D converted.

Further, shown in FIG. 3 is the analog-digital converter described in Japanese Patent Laid-Open No. 2000-338159.

The analogue-digital converter shown in FIG. 3 comprises plural pairs of channel terminals 1102; first circuits 1101 connected to each of the plural pairs of channel terminals 1102; a amplifier 1103 connected in series to each of the first circuits 1101; an analog-digital converter 1110 connected to an output terminal of the amplifier 1103; a sampling capacitor Cs extended in parallel to two input terminals of the amplifier 1103; and a discharging switch SWd connected in parallel to the sampling capacitor Cs between two input terminals of the amplifier 1103.

Each of the first circuits 1101 comprises resistors Ri1, Ri2 connected respectively to plural pairs of channel terminals 1102; switches SWi connected in series respectively to resistors Ri1, Ri2; and capacitors Ci connected in parallel to resistors Ri1, Ri2.

In this analog-digital converter, the sampling capacitor Cs is added with the discharging switch SWd, and the discharging switch SWd is turned ON prior to the sampling period of time, so that a residual voltage of the sampling capacitor Cs is discharged.

However, these prior arts have been carrying problems as described below.

A first problem is that one channel is wasted from the analog input channels.

The reason why is because, as shown in FIG. 1, one channel CHn is connected to the ground as a discharging channel. Accompanied with the complexity and deepening upgrading of the system including the A/D converters, the number of sensors and other signal sources are also increasing. At the same time, there are demands that the number of terminals of the A/D converters or LSIs with built-in A/D converters is limited to the minimum possible in view of the cost or the mounting area involved. Besides, there are often the cases where even one channel cannot be wasted.

A second problem is that the prior arts are at a disadvantage in the cost or the consumption current involved. The reason why is because, as shown in FIG. 2 or 3, in order to discharge the residual voltage of the sampling capacitors 1004, Cs, there arise a demand for newly adding the charging and discharging circuit 1013 or the charging switch SWd to the analog-digital converter.

A third problem is that the prior arts can discharge the voltage of the sampling capacitor only to some fixed electric potential.

The reason why is because the prior arts connect one channel CHn to the ground (FIG. 1) or are constituted such that the discharge is made by the charging and discharging circuit (FIG. 2) or the discharging switch (FIG. 3).

There are various types available in the sensors which become the signal sources, and the voltage characteristics thereof are also various. When the residual voltage of the sampling capacitor is discharged, there are sometimes the cases where the discharging to other electric potentials rather than to the ground electric potential may be suitable for the controller including the sampling capacitor. However, in the conventional A/D converter shown in FIG. 1, FIG. 2 or 3, the voltage of the sampling capacitor can be discharged only to some fixed electric potential.

SUMMARY OF THE INVENTION

The present invention has been carried out in view of the above-described problems of the conventional analog-digital converter and aims to provide an analog-digital converter and a method of converting a data of the same, which makes it possible to set a discharge voltage of a sampling capacitor to a desired voltage value without wasting any of the channel terminals and, moreover, without newly adding external equipment such as a charge and discharge circuit, a discharge switch and the like.

To detect an open failure of the analog input portion such as the coming off of terminals of the sensor or the A/D converter or the breaking of a wire between the sensor and the A/D converter in various controllers for converting the voltage of the sensor and other equipment into the digital value and performing the processing, the conventional analog-digital converter has connected a specific analog input terminal to the ground.

The conventional analog-digital converter has used the terminal which has to be primarily used for the A/D conversion and the terminal which is connected to the ground alternately, so that the sampling capacitor in the interior of the A/D converter has been discharged at every time of the terminal connecting timing.

In contrast to this, the A/D converter according to the present invention has realized a function in which a D/A converter is built in the A/D converter and this D/A converter is controlled to a zero scale voltage output subsequent to the A/D conversion and the output voltage of the D/A converter is sampled so that the A/D converter is allowed to discharge the sampling capacitor by itself.

Specifically, the present invention is an analog-digital converter comprising a sampling capacitor and a digital-analog converter, and the digital-analog converter performs the discharging of the residual voltage of the sampling capacitor at least one of prior and subsequent to the analog-digital conversion by the analog-digital converter.

This digital-analog converter can set the discharge of the residual voltage of the sampling capacitor to at least one of a zero scale voltage, a full-scale voltage and a random voltage between the zero scale voltage and the full-scale voltage.

Further, the present invention comprises a plurality of analog input terminals; channel selection means for selecting one analog input terminal from among the plurality of analog input terminals; a sampling capacitor in which the voltage of the analog input terminal selected from the channel selection means is sampled; a digital-analog converter; a first switch connecting the output of the digital-analog converter to the sampling capacitor; an input terminal which sets the output of the sampling capacitors as the input; a comparator having an input terminal for taking the output of the sampling capacitor as an input and a grounded input terminal; and a resistor for controlling the digital-analog converter according to the output of the comparator; wherein the digital-analog converter performs the discharge of the residual voltage of the sampling capacitor prior or subsequent to the analog-digital conversion.

This digital-analog converter can set the residual voltage of the sampling capacitor to at least one of a zero scale voltage, a full-scale voltage and a random voltage between the zero scale voltage and the full-scale voltage.

Further, the present digital-analog converter can comprise a second switch for sampling the voltage of the analog input terminal selected by the channel selection means in the sampling capacitor. In this case, the second switch is turned ON so that a parasitic capacitance existing in a node between the channel selection means and the sampling capacitor can be eliminated.

Further, the present digital-analog converter can further comprise a timing control means for controlling an operation timing of the analog-digital converter. In this case, a resistor can be set such that the discharge voltage of the sampling capacitor is set to at least one of a zero scale voltage and a full-scale voltage by the timing signal from the timing control means subsequent to the completion of the analog-digital conversion. For example, in a 8 bit analog-digital converter, the resistor is set to a 00H or a FFH.

The present digital-analog converter can comprise a selection circuit for receiving a signal from the outside and transmitting to the resistor a signal which sets the discharge voltage of the sampling capacitor to at least one of any one of the zero scale voltage and the full-scale voltage.

The resistor can set a discharge potential of the sampling capacitor according to a charge clearing data inputted from the outside subsequent to the completion of the analog-digital conversion.

The comparator can be constituted such that the voltage sampled in the sampling capacitor and the output voltage of the digital-analog converter are compared.

The present digital-analog converter can further comprise a second switch for allowing the voltage of the analog input terminal selected by the channel selection means to be sampled in the sampling capacitor. In this case, the first and second switches are turned ON during a charge clearing period so that the digital-analog converter can eliminate the residual voltage of the sampling capacitor.

In the present digital-analog converter, subsequent to the start of the analog-digital conversion and prior to the sampling period, it is preferable that a charge clearing period is provided.

Further, the present invention is a method for performing an analog-digital conversion executed in the analog-digital converter comprising a sampling capacitor and a digital-analog converter, and comprises a process for performing the analog-digital conversion and a process for performing the discharge of the residual voltage of the sampling capacitor by the digital-analog converter at least one of prior and subsequent to the analog-digital conversion.

It is preferable that the present method comprises a process for setting the discharge of the residual voltage of the sampling capacitor to at least one of a zero scale voltage, a full-scale voltage and a random voltage between the zero scale voltage and the full-scale voltage.

Further, the present invention is a method for converting a data of the analog-digital converter executed in the analog-digital converter comprising the sampling capacitor and the digital-analog converter, and provides a method for converting a data of the analog-digital converter, which comprises: a first process for allowing the voltage of one analog input terminal to be sampled in the sampling capacitor; a second process for comparing the sampled voltage and the output voltage of the digital-analog converter; a third process for deciding the voltage to be compared next according to the output in the second process and performing the analog-digital conversion by repeating these operations; a fourth process for resetting the resistor which controls the digital-analog converter subsequent to the completion of the analog-digital conversion and sampling the output voltage of the digital-analog converter; and a fifth process for allowing a predetermined voltage to be sampled in the sampling capacitor according to the value set in the resistor.

It is preferable that the present method comprises a sixth process for setting a predetermined voltage sampled in the sampling capacitor to at least one of a zero scale voltage, a full-scale voltage and a random voltage between the zero scale voltage and the full-scale voltage.

The sixth process can set the voltage sampled in the sampling capacitor to any one of a zero scale voltage and a full-scale voltage according to the signal from the outside.

It is preferable that the present method comprises a seventh process for setting the voltage sampled in the sampling capacitor according to the charge clearing data inputted from the outside subsequent to the completion of the analog-digital conversion.

BRIEF DESCRIPTION OF THE DRAWINGS

FIG. 11 is a timing chart showing the operation of the analog-digital converter according to a sixth embodiment of the present invention.

DETAILED DESCRIPTION OF THE PREFERRED EMBODIMENTS

Next, embodiments of an A/D converter, which is the present invention, will be described with reference to the accompanying drawings.

(First Embodiment)

Figure 4:
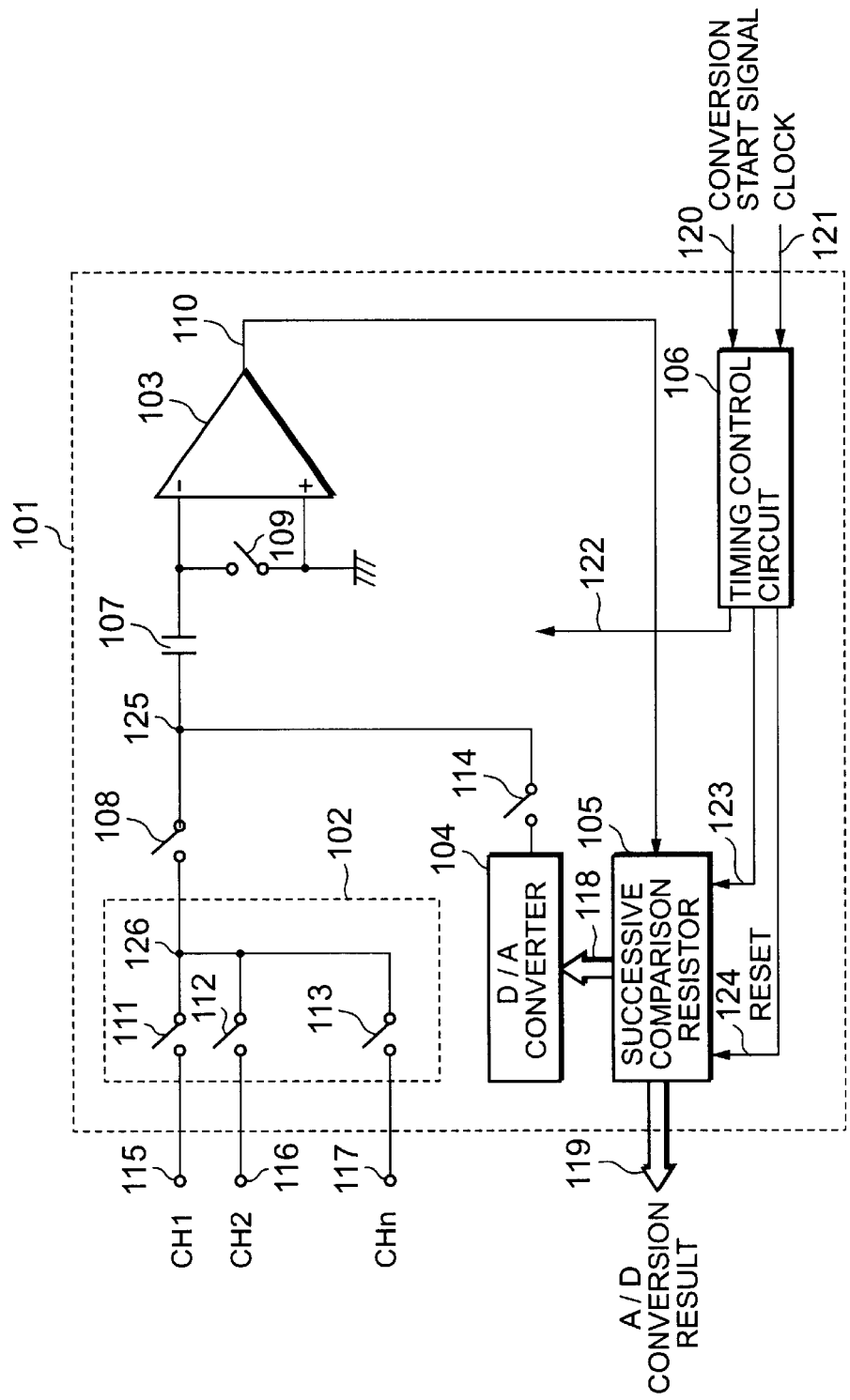
FIG. 4 is a block diagram showing the structure of the analog-digital converter according to a first embodiment of the present invention.
Figure 5:
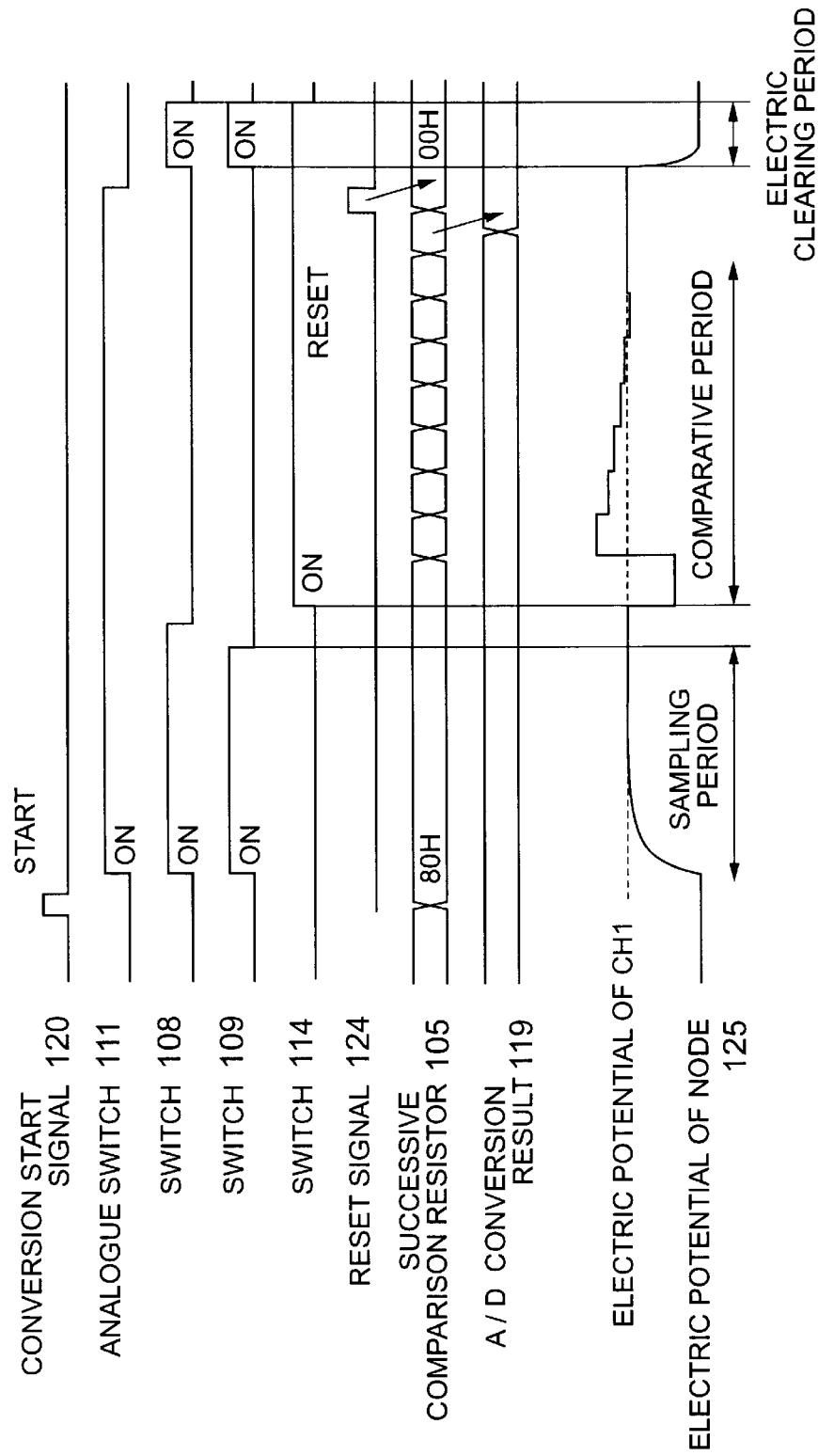
FIG. 5 is a timing chart showing an operation of the analog-digital converter according to the first embodiment of the present invention shown in FIG. 4.

FIG. 4 is a block diagram of a successive approximation type analog-digital (A/D) converter 101 according to a first embodiment of the present invention, and FIG. 5 is a timing chart showing an operation of the A/D converter 101.

The A/D converter 101 according to the first embodiment comprises: analog switches 111, 112, 113 connected respectively to analog input terminals 115, 116, 117 corresponding to a plurality of channels CH1, CH2, CHn;

a channel selection portion 102 for selecting one analog input terminal from among a plurality of analog input terminals 115, 116, 117, and a sampling capacitor 107;

an analog switch 108 for performing ON-OFF at the time when a voltage of the analog input terminal selected by the channel selection portion 102 is sampled in the sampling capacitor 107;

a comparator 103 in which the one input terminal is connected to the sampling capacitor 107 and the other input terminal is connected to the ground;

an analog switch 109 which connects an electrode of the comparator input side of the sampling capacitor 107 to the ground;

a digital-analog (D/A) converter 104 which converts a digital signal to an analog signal;

an analog switch 114 which connects an output of the D/A converter 104 to the sampling capacitor 107;

a successive approximation resistor 105 which receives an output signal 110 showing an comparison result of the comparator 103 and controls the D/A converter according to the received output signal 110; and a timing control portion 106 for controlling the whole timing of the A/D converter 101.

The channel selection portion 102 receives a selection signal 122 from the timing control circuit 106, and the analog switches 111, 112, 113 only which are connected to the analog input terminals 115, 116, 117 corresponding to the channels CH1, CH2, CHn designated by the selection signal 122 are turned ON.

For example, in the case where the channel CH1 is selected by the selection signal 122, the analog switch 111 only is turned ON, and in the case where the channel CH2 is selected by the selection signal 122, the analog switch 112 only is turned ON or in the case where the channel CHn is selected by the selection signal 122, the analog switch 113 only is turned ON.

The timing control circuit 106 is inputted with a conversion-start signal 120 and a clock 121, and outputs the selection signal 122 selecting each of the analog switches 111, 112, 113, a control signal 123 controlling the successive approximation resistor 105 and a reset signal 124 resetting the successive approximation resistor 105.

Next, the operation of the successive approximation type A/D converter 101 shown according to the present embodiment in FIG. 4 will be described with reference to the timing chart shown in FIG. 5.

Referring to FIG. 5, when the conversion-start signal 120 reaches a high level, the timing control circuit 106 starts an operation according to the clock 121 so as to start the A/D conversion operation. Here, the resolution of the A/D converter 101 should be set to 8 bit so that the channel CH1 is selected.

Next, when the entrance into a sampling period is gained by the timing control circuit 106, the analog switch 111 and the analog switches 108, 109 corresponding to CH1 are turned ON so that the voltage of the channel CH1 is charged to the sampling capacitor 107.

Next, when the timing control circuit 106 counts a predetermined sampling period, the timing control circuit 106 turns OFF the analog switches 108, 109 and holds the sampled voltage.

Subsequently, when the entrance into a comparative period is gained, the analog switch 114 is turned ON. Further, the sampled voltage and the output voltage of the D/A converter 104 are inputted to the comparator 103, and the comparator 103 compares these two voltages.

The comparator 103 transmits the output signal 110 showing the comparison result to the successive approximation resistor 105. The successive approximation resistor 105 decides the voltage to be compared next according to the comparison result shown by the output signal 110, and outputs a control signal 118 showing that voltage to the D/A converter 104.

After repeating these series of operations predetermined times (eight times in the case of the 8 bit A/D converter), the successive approximation resistor 105 outputs a signal 119 showing the A/D conversion result.

Subsequent to the completion of the A/D conversion operations, the timing control circuit 106 turns OFF the analog switch 111, and further turns OFF all the other analog switches 112, 113 of the channel selection portion 102.

Next, the timing control circuit 106 transmits the reset signal 124 to the successive approximation resistor 105. This reset signal 124 resets the successive approximation resistor 105 to a 00H, and further turns ON the analog switches 108, 109, 114. This state allows the output voltage of the D/A converter 104 to be put into a sampled state.

Since the successive approximation resistor 105 is reset to the 00H, a zero scale voltage is outputted from the D/A converter 104. As shown in the electric charge clearing period shown in FIG. 5, the zero scale voltage is sampled in the sample capacitor 107.

That is, prior to the sampling of the zero scale voltage by the sampling capacitor 107, the voltage of the channel CH1 which is A/D converted is cleared.

Further, since a node 126 is connected with all the analog switches 111, 112, 113 of the interior of the channel selection portion 102, the parasitic capacitance existing in the node 123 is not low.

The parasitic capacitance existing in the node 126 serves also as a kind of a sampling capacitor. Since the analog switch 108 is also turned ON, the residual voltage of the parasitic capacitance existing in the node 126 can be also cleared at the same time with the residual voltage of the sampling capacitor 107.

Next, assume the case that the channel CH2 is selected, where an open failure is contemplated to have occurred in which the analog input terminal 116 corresponding to the channel CH2 is dislocated. In this case, even if the analog switches 112, 108, 109 are turned ON subsequent to the entrance into the sampling period, the charging to the sampling capacitor 107 is not performed.

Accordingly, since the zero scale voltage remains still in a state of being sampled by the electric charge clearing operation executed previously, the signal 119 showing the A/D conversion result outputted by the successive approximation resistor 105 shows a voltage close to the zero scale voltage.

Assuming that the electric charge clearing was not performed, the sampling capacitor 107 remains in a state of sampling the voltage of the channel CH1. Accordingly, the voltage close to the voltage of the channel CH1 is obtained as the A/D conversion result of the channel CH2 and, depending on the situation, there is a possibility of causing an erroneous processing. However, since the residual voltage of the sampling capacitor 107 is cleared, such an occurrence of the erroneous processing can be prevented.

Moreover, in the case where the residual voltage only of the sampling capacitor 107 was cleared with the analog switch 108 turned OFF, the parasitic capacitance f the node 126 remains in a state of holding the voltage of the channel CH1. When the voltage of the channel CH2 is A/D converted, a capacitance potential voltage is generated by the sampling capacitor 107 and the parasitic capacitance of the node 126.

Depending on the volume of the parasitic capacitance of the node 126, there are sometimes the cases where the effectiveness of clearing the residual voltage of the sampling capacitor 107 is not much obtained.

However, in the A/D converter 101 according to the present embodiment, since the analog switch 108 is also turned ON so as to clear the residual voltage of the parasitic capacitance of the node 126 at the same time, such a problem does not occur.

Further, in the case where the sensor (not shown) connected to the channel CH2 is a sensor which does not output the voltage close to the vicinity of the zero scale, the voltage close to the vicinity of the zero scale obtained as a result of the A/D conversion can be determined as an abnormal voltage. That is, a determination can be made that a failure of some kind or another has occurred. For this reason, the processing of that failure can be immediately performed.

As described above, according to the A/D converter 101 of the present embodiment, even in the case where the open failure of the analog input portion has occurred, the occurrence of the erroneous processing can be prevented. Furthermore, the occurrence of the failure can be determined, thereby improving the reliability of the device mounted with the A/D converter 101.

Hereinafter, the advantages obtained by the A/D converter 101 according to the present embodiment will be specifically described.

A first advantage is that the reliability of the device including the A/D converter 101 can be improved. The reason why is because the electric charge of the sampling capacitor 107 and the internal node 126 associated therewith is cleared by the A/D converter 101 subsequent to the A/D conversion.

In this way, even in the case where the open failure of the analog input portion has occurred, the voltage of the channel A/D converted prior to the occurrence of the failure is cleared. For this reason, the obtaining of the erroneous conversion result to enter into the erroneous processing because of the situation where the voltage of the channel A/D converted prior to the occurrence of the failure is again A/D converted can be prevented.

A second advantage is that there is no need to waste even one piece of the analog input terminals. The reason why is because, as can be seen clearly from the block diagram of the A/D converter 101 according to the present embodiment shown in FIG. 4, there is no need for a specific analog terminal to be connected to the ground in order to clear the voltage held in the sampling capacitor 107.

Figure 1:
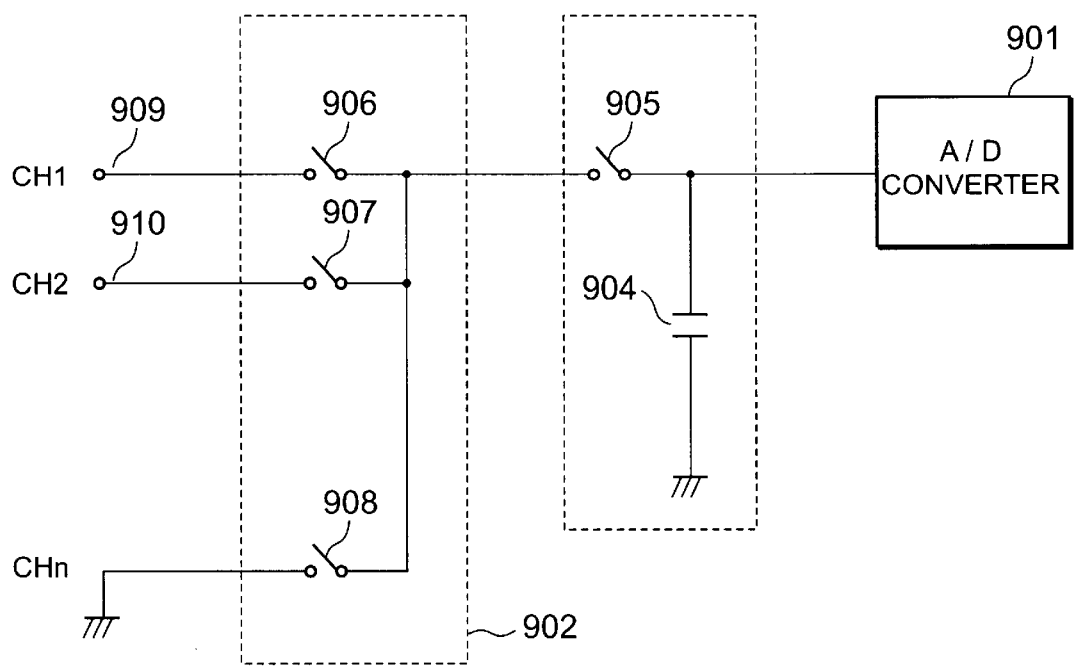
FIG. 1 is a block diagram showing a structure of a first conventional analog-digital converter.
Figure 2:
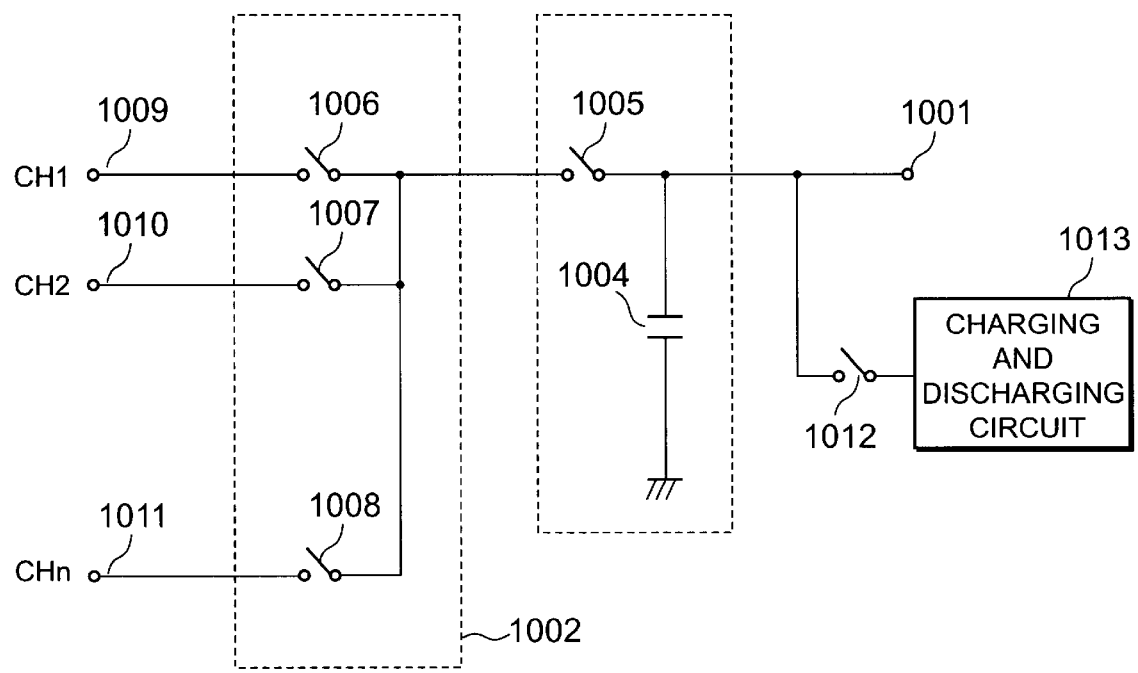
FIG. 2 is a block diagram showing the structure of a second conventional analogue-digital converter.
Figure 3:
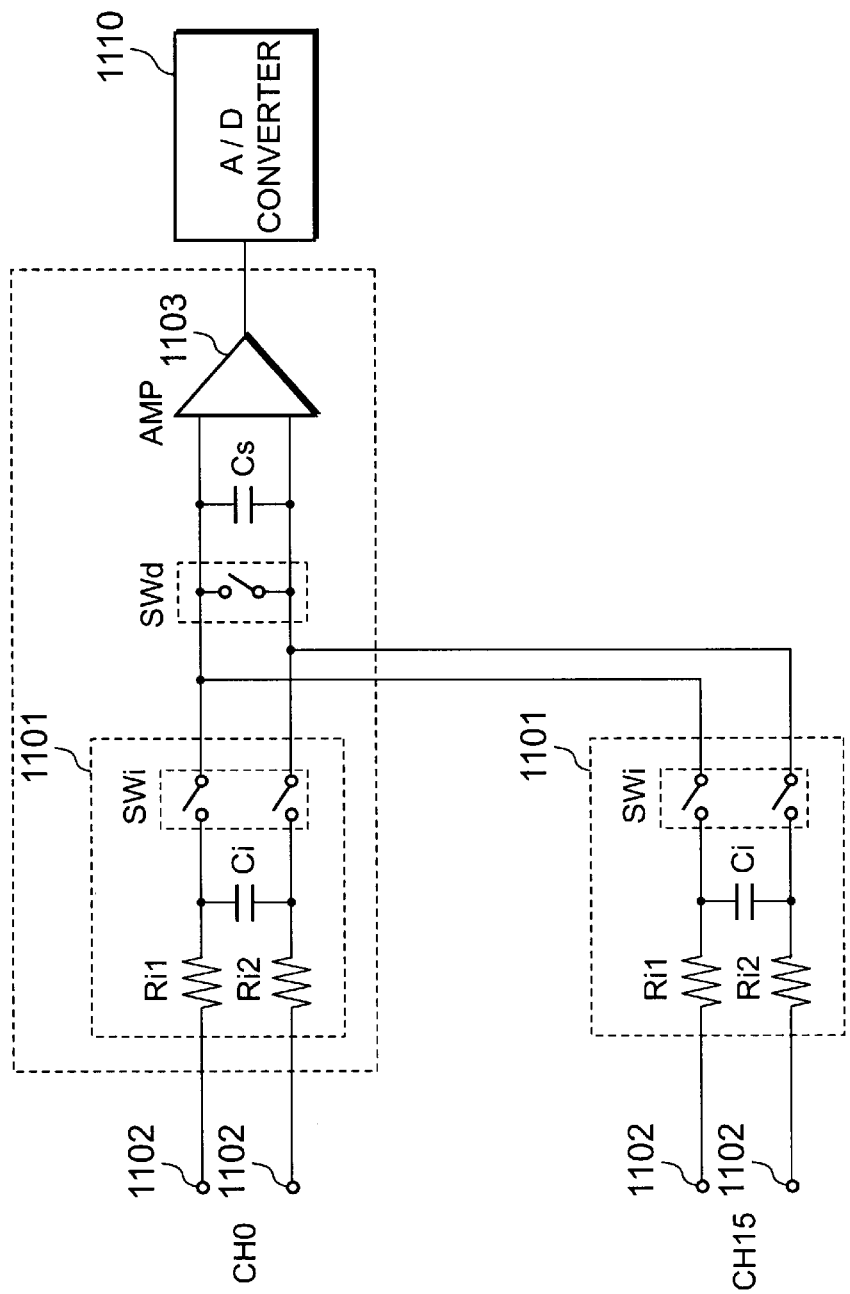
FIG. 3 is a block diagram showing the structure of a third conventional analogue-digital converter.

A third advantage is that there is no need to provide a specific charging and discharging circuit such as the charging and discharging circuit 1013 shown in FIG. 2. In this way, it is also possible to prevent the increase in the consumption current.

The reason why is because the voltage held in the sampling capacitor 107 can be cleared by using not the charging and discharging circuit but the built-in D/A converter 104.

A fourth advantage is that a clearing manner when the voltage held in the sampling capacitor 107 is cleared can be set at random. In this way, it is possible to decide whether or not the voltage should be cleared to the zero scale side or the full-scale side according to the characteristic of the sensor to be used.

The reason why is because the converter 101 is constituted such that the value of the successive approximation resistor 105 to be set during the electric charge clearing period subsequent to the completion of the A/D conversion can be set to a zero scale or a full-scale or a random value between the zero scale and the full-scale.

[Second Embodiment]

Figure 6:
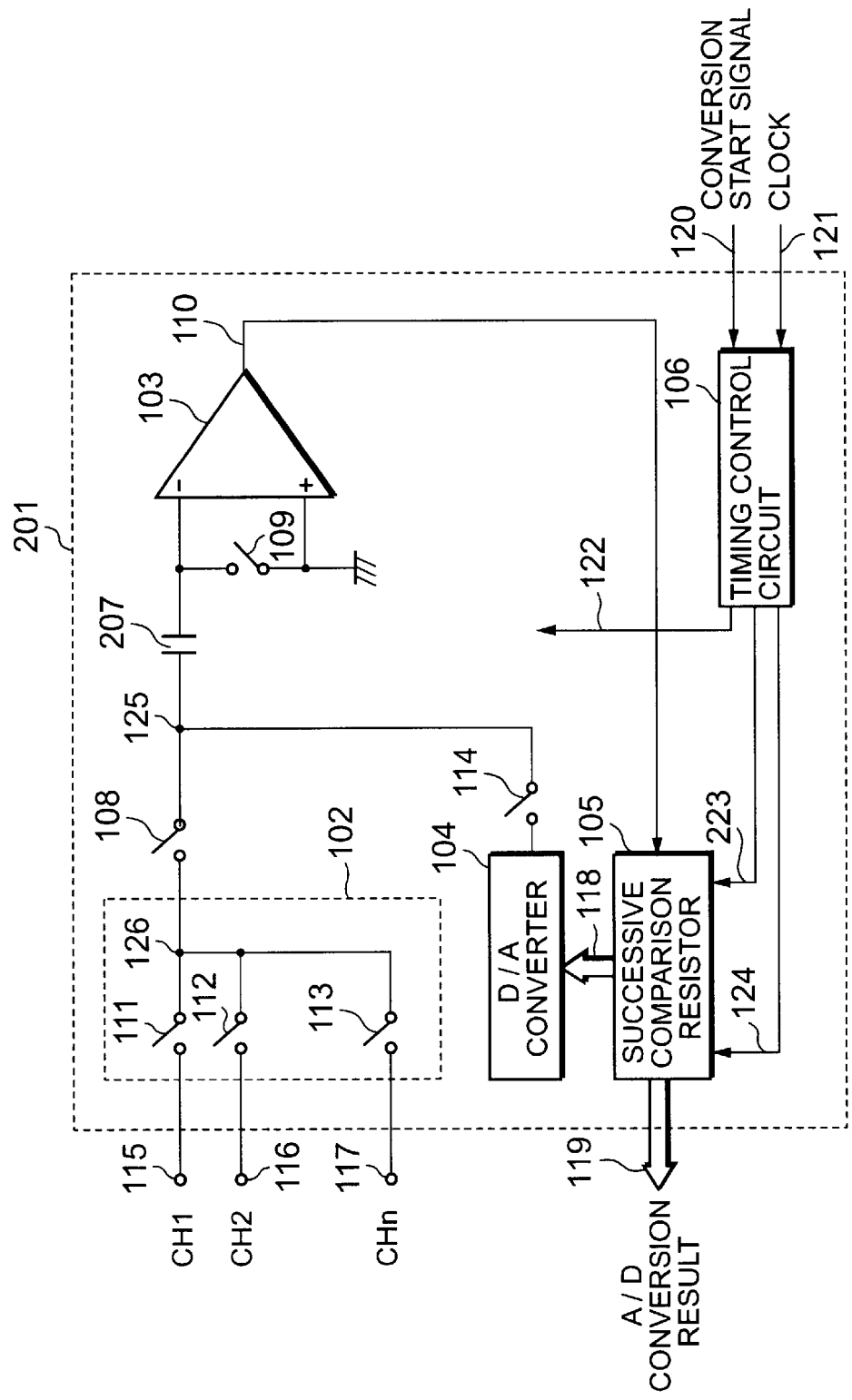
FIG. 6 is a block diagram showing the structure of the analog-digital converter according to a second embodiment of the present invention.
Figure 7:
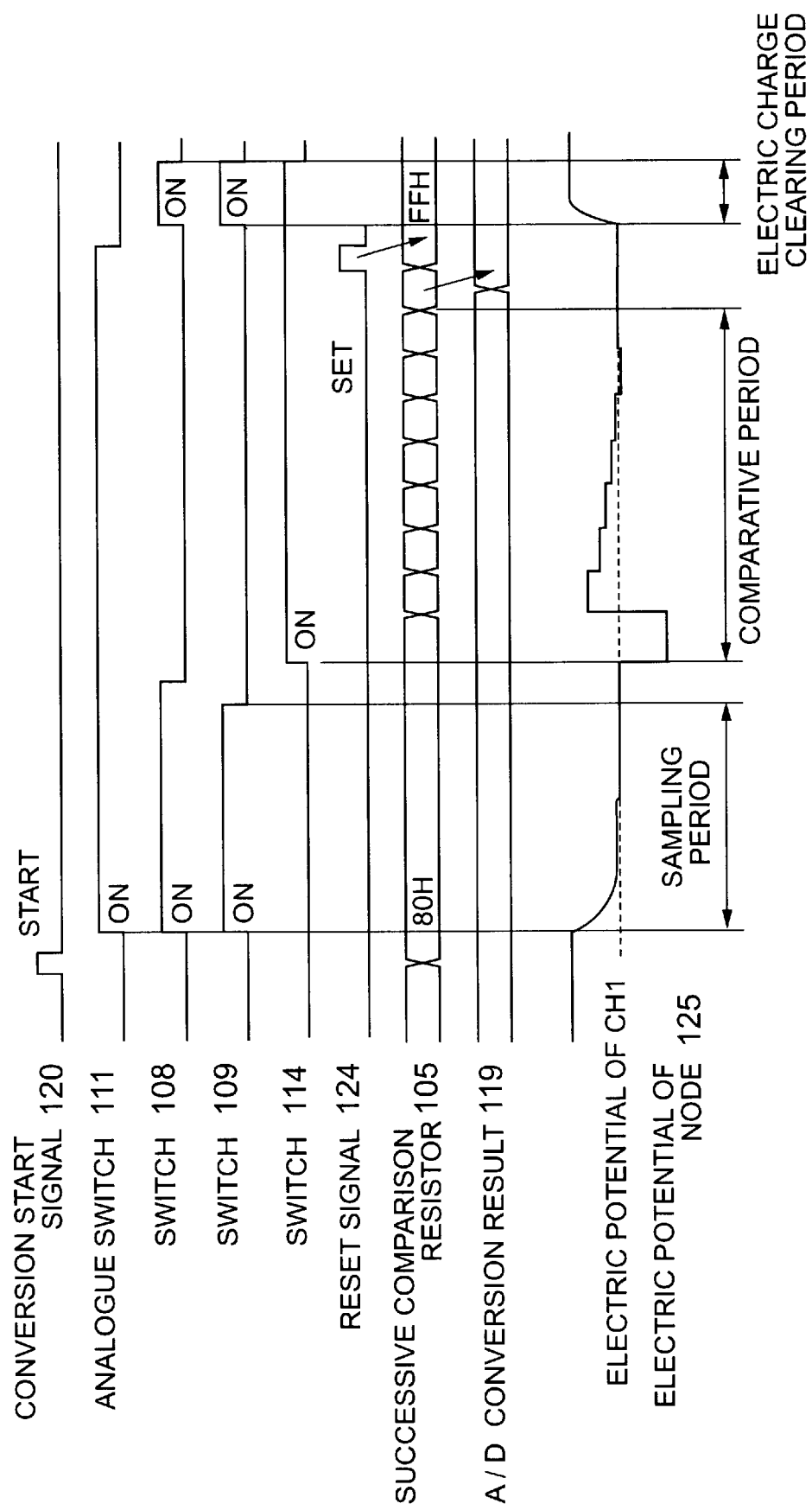
FIG. 7 is a timing chart showing the operation of the analog-digital converter according to the second embodiment of the present invention shown in FIG. 6.

FIG. 6 is a block diagram showing a structure of an A/D converter 201 according to a second embodiment of the present invention, and FIG. 7 is a timing chart showing an operation of the A/D converter 201.

The A/D converter 201 according to the present embodiment has the same structure as that of the A/D converter 101 according to the first embodiment shown in FIG. 4.

However, as described below, in the A/D converter 201 according to the present embodiment, the value of the discharge voltage of the sampling capacitor 207 is different from the value of the A/D converter 101 according to the first embodiment.

That is, while the A/D converter 101 according to the first embodiment sets the discharge voltage of the sampling capacitor 107 to the zero scale side, the A/D converter 201 according to the second embodiment sets the discharge voltage of the sampling capacitor 207 to the full-scale side.

Specifically, while the A/D converter 101 according to the first embodiment allows the timing control circuit 106 to output the reset signal 124 to the successive approximation resistor 105, the A/D converter 201 according to the second embodiment allows the timing control circuit 106 to output a set signal 223 to the successive approximation resistor 105. For this reason, as shown in the timing chart shown in FIG. 7, the successive approximation resistor 105 is set to a FFH and the sampling capacitor 207 is cleared to the full-scale side subsequent to the completion of the A/D conversion.

[Third Embodiment]

Figure 8:
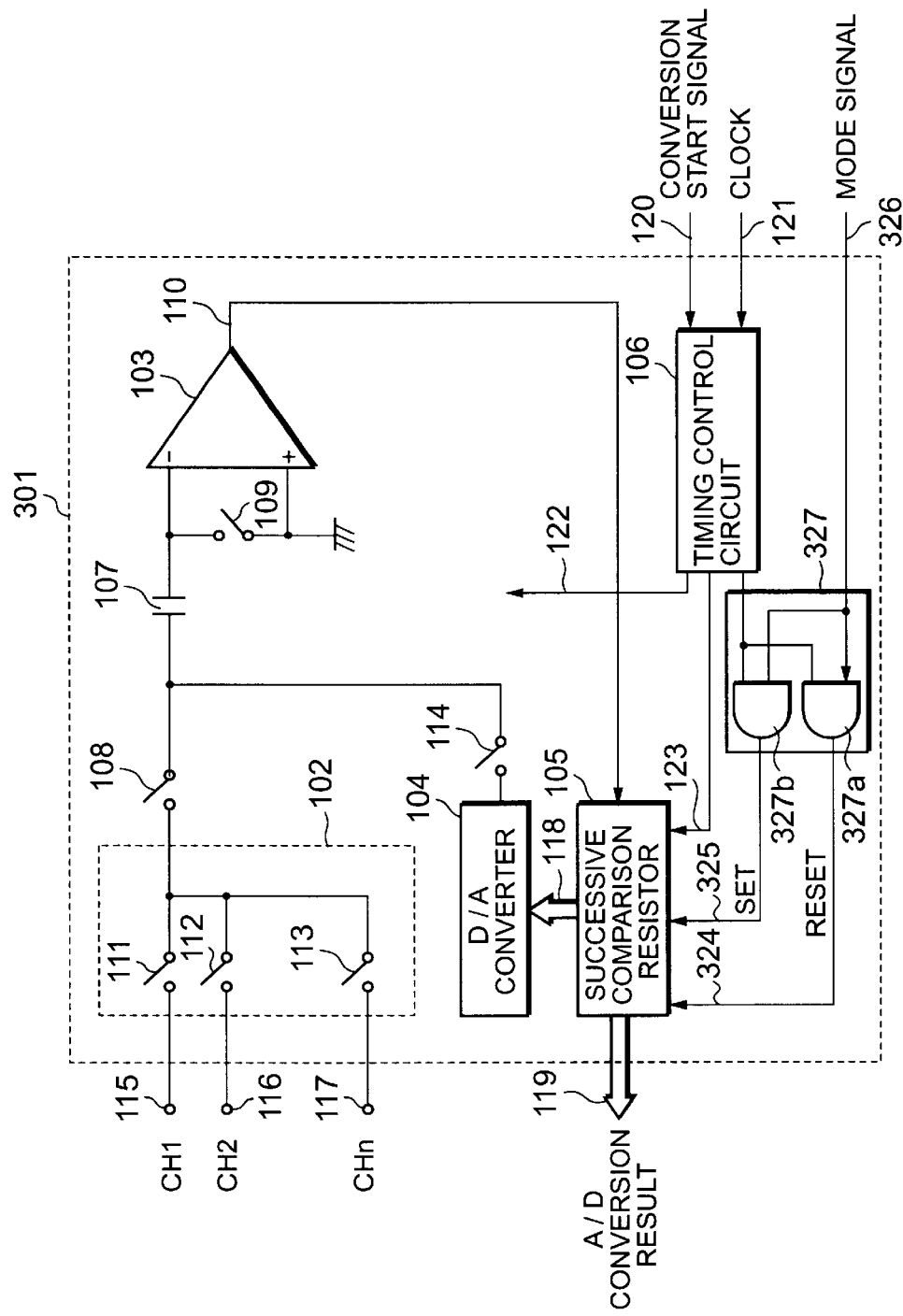
FIG. 8 is a block diagram showing the structure of the analog-digital converter according to a third embodiment of the present invention.

FIG. 8 is a block diagram showing a structure of an A/D converter 301 according to a third embodiment of the present invention.

The A/D converter 301 according to the present embodiment additionally comprises a selection circuit 327 in contrast to the A/D converter 101 according to the first embodiment shown in FIG. 4.

The selection converter 327 comprises two AND circuits 327a, 327b, each of which is inputted with an output signal from a timing control circuit 106 and a mode signal 326 as an external signal. The AND circuits 327a, 327b perform logical operations based on these two signals, and the selection circuit 327 either transmits a reset signal 324 from the AND circuit 327a to a successive approximation resistor 105 or transmits a set signal 325 from the AND circuit 327b to the successive approximation register 105.

According to the A/D converter 301 according to the third embodiment, it is possible to select the setting or the resetting of the successive approximation resistor 105 according to the mode signal 326 received by the selection circuit 327. In this way, it is possible to select whether or not a sampling capacitor 107 should be cleared to a zero scale side or a full-scale side.

[Fourth Embodiment]

Figure 9:
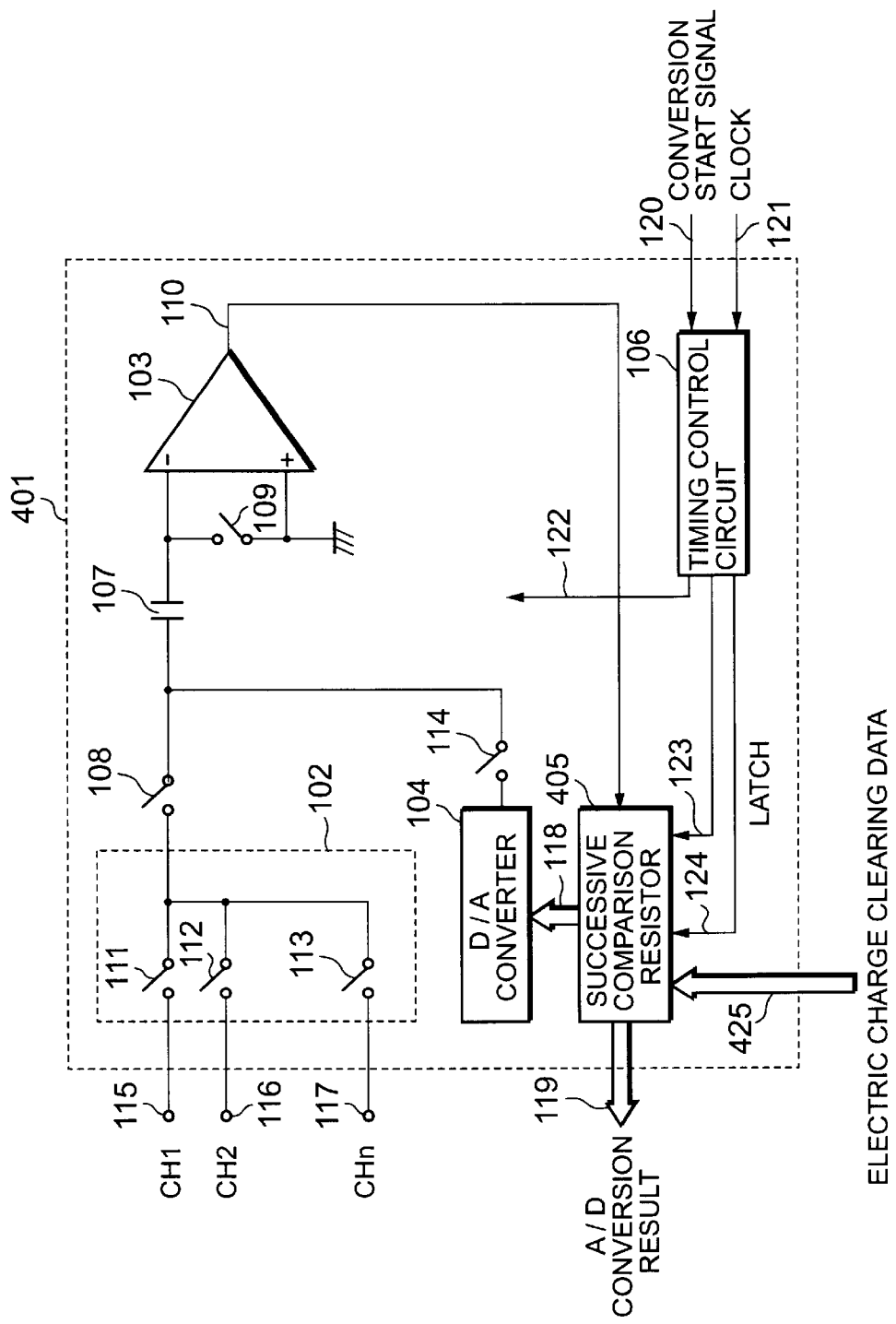
FIG. 9 is a block diagram showing the structure of the analog-digital converter according to a fourth embodiment of the present invention.

FIG. 9 is a block diagram showing a structure of an A/D converter 401 according to a fourth embodiment of the present invention.

In contrast to the A/D converter 101 according to the first embodiment shown in FIG. 4, the A/D converter 401 according to the present embodiment is different in the structure of a successive approximation resistor 405 from the structure of the successive approximation resistor 105 in the first embodiment. The structure other than the successive approximation resistor 405 is the same as the structure of the A/D converter 101 according to the first embodiment.

Specifically, the successive approximation resistor 405 is inputted with an electric charge clearing data 625 from the outside. The value of the successive approximation resistor 405 is set to a value shown by the electric charge clearing data 425 subsequent to the completion of the A/D conversion. For this reason, an electric potential of the sampling capacitor 107 can be set to a random electric potential according to the characteristic of a sensor to be used.

In this way, according to the A/D converter 401 according to the present embodiment, it is possible to set at random the value of the successive approximation resistor 405 during the electric charge clearing period.

[Fifth Embodiment]

Figure 10:
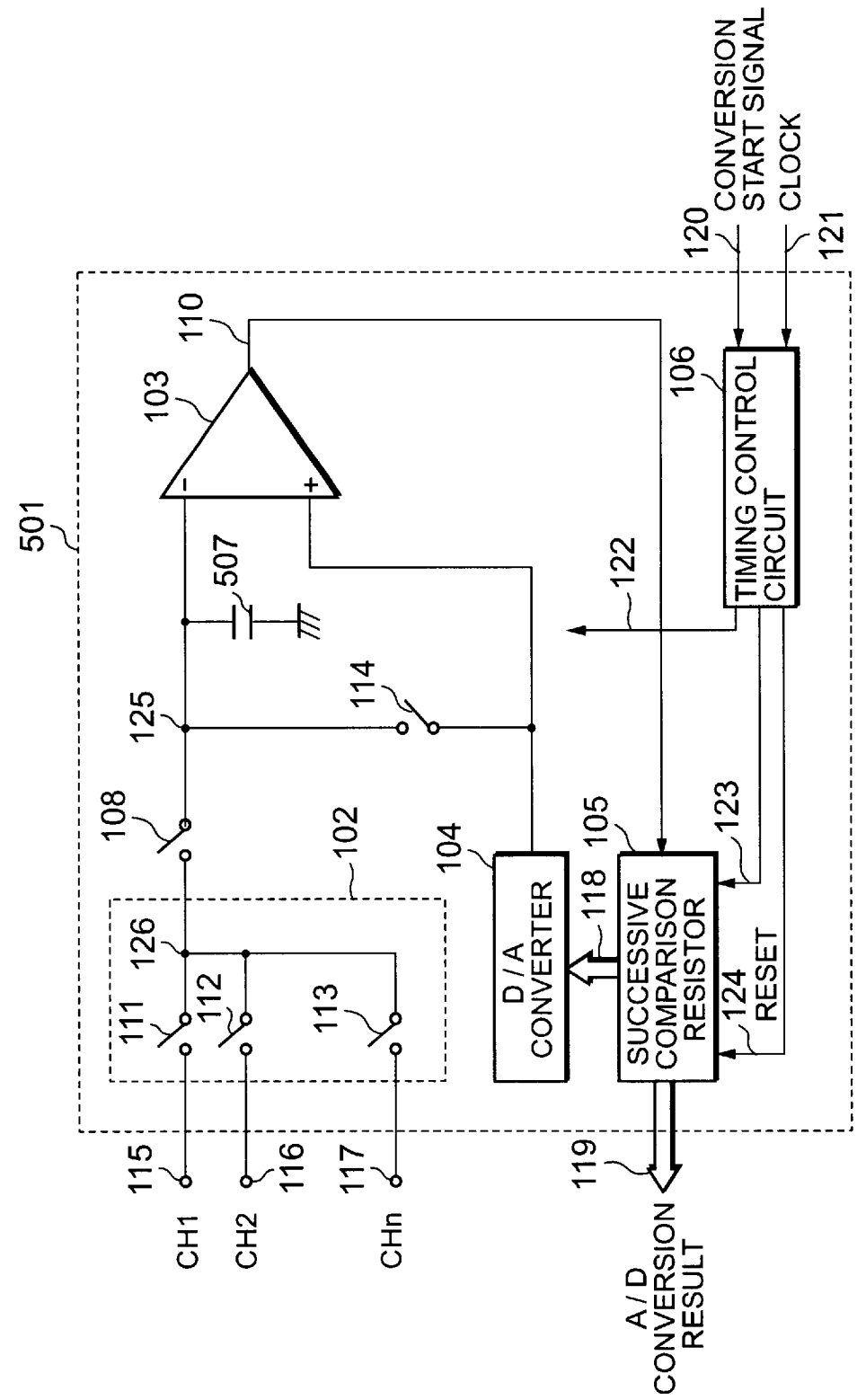
FIG. 10 is a block diagram showing the structure of the analog-digital converter according to a fifth embodiment of the present invention.

FIG. 10 is a block diagram showing a structure of an A/D converter 501 according to a fifth embodiment of the present invention.

The A/D converter 501 according to the present embodiment is different in the following points only in contrast to the A/D converter 101 according to the first embodiment shown in FIG. 4, and the structure other than the following points is the same as that of the A/D converter 101 according to the first embodiment.

A first different point is that the A/D converter 501 according to the present embodiment is not provided with the switch 109, which is provided to the A/D converter 101 according to the first embodiment. Instead of that, a sampling capacitor 507 in the present embodiment has its one end always connected to the ground.

A second different point is that the output voltage of a D/A converter 704 is always directly inputted to a comparator 103.

In the A/D converter 501 according to the present embodiment, the voltage sampled in the sampling capacitor 507 and the output voltage of the D/A converter 704 are directly inputted to the comparator 103 together, and are compared in the comparator 103. Even in this case, analog switches 108, 114 are turned ON during the charge clearing period so that the residual voltage of the sampling capacitor 507 can be cleared by the D/A converter 704.

[Sixth Embodiment]

FIG. 11 is a timing chart showing the operation of the D/A converter according to the present embodiment.

Although the A/D converters 101, 201, 301, 401, 501 according to the first to fifth embodiments shown in FIGS. 4 to 10 are provided with the electric charge clearing period subsequent to the completion of the A/D conversion, as shown in FIG. 11, even when the converters are controlled to enter the sampling period by passing through the electric charge clearing period immediately after the A/D conversion start signal is inputted, the same advantages as those of the first to fifth embodiments can be obtained.

As described above, according to the analog-digital converter and the method of converting a data of the same according to the present invention, the following advantages are available.

Firstly, the reliability of the device adopting the A/D converter according to the present invention can be improved.

According to the A/D converter according to the present invention, even in the case where an open failure of the analog input portion occurs, the voltage of the channel A/D converted prior to the occurrence of the failure is cleared. For this reason, the output of an erroneous conversion result as well as an erroneous processing because of the situation where the voltage of the channel A/D converted prior to the occurrence of the failure is again A/D converted can be prevented.

Secondly, there is no need to waste the analog input terminals. In the conventional analog-digital converter, there is the need to connect a specific analog input terminal to the ground so as to clear the voltage held in the sampling capacitor. However, in the A/D converter according to the present invention, since the D/A converter built into the A/D converter clears the residual electric charge of the sampling capacitor, there is no need to connect a specific analog input terminal to the ground.

Thirdly, there is no need to provide a specific charging and discharging circuit such as the charging and discharging circuit possessed by the conventional A/D converter. In this way, the current for driving the charging and discharging circuit can be reduced and it is, therefore, possible to prevent an increase in the consumption current.

Fourthly, it is possible to set the value of the successive approximation resistor, which is set during the electric charge clearing period subsequent to the completion of the A/D conversion, to a zero scale or a full-scale or a random value between the zero scale and the full-scale. For this reason, it is possible to decide whether or not the value of the successive approximation resistor should be cleared to the zero scale side or the full-scale side according to the characteristic of the sensor to be used.

What is claimed is:

1. An analog-digital converter, comprising:
a sampling capacitor in which a voltage of an analog input terminal is sampled; and
a digital-analog converter for performing a discharge of a residual voltage of said sampling capacitor at a timing at least one of prior and subsequent to an analog-digital conversion.

2. The analog-digital converter according to claim 1, wherein the discharge of the residual voltage of said sampling capacitor can be set to at least one of a zero scale voltage, a full-scale voltage and a random voltage between said zero scale voltage and said full-scale voltage.

3. An analog-digital converter, comprising:
a plurality of analog input terminals;
channel selection means for selecting one analog input terminal from among said plurality of analog input terminals;
a sampling capacitor in which the voltage of the analog input terminal selected by said channel selection means is sampled;
a digital-analog converter for performing the discharge of the residual voltage of said sampling capacitor at a timing at least one of prior and subsequent to the analog-digital conversion;
a first switch for connecting the output of said digital-analog converter to said sampling capacitor;
a comparator having an input terminal which takes the output of said sampling capacitor as an input and a grounded input terminal; and
a resistor for controlling said digital-analog converter according to the output of said comparator.

4. The analog-digital converter according to claim 3, wherein said digital-analog converter can set the discharge of the residual voltage of said sampling capacitor to at least one of a zero scale voltage, a full-scale voltage and a random voltage between said zero scale voltage and said full-scale voltage.

5. The analog-digital converter according to claim 3, further comprising: a second switch for sampling the voltage of the analog input terminal selected by said channel selection means in said sampling capacitor and eliminating a parasitic capacitance existing in a node between said channel selection means and said sampling capacitor by being turned ON.

6. The analog-digital converter according to claim 3, further comprising: timing control means for controlling an operational timing of the analog-digital converter; and
wherein said resistor is set so that the electric discharging voltage of said sampling capacitor is set to at least one of a zero scale voltage and a full-scale voltage by a timing signal from said timing control means subsequent to the completion of the analog-digital conversion.

7. The analog-digital converter according to claim 3, further comprising: a selection circuit for receiving a signal from the outside and transmitting a signal for setting the discharge voltage of said sampling capacitor to at least one of a zero scale voltage and a full-scale voltage to said resistor.

8. The analog-digital converter according to claim 3, wherein said resistor sets a discharge potential of said sampling capacitor according to an electric charge clearing data inputted from the outside subsequent to the completion of the analog-digital conversion.

9. The analog-digital converter according to claim 3, wherein said comparator compares the voltage sampled in said sampling capacitor and the output voltage of said digital-analog converter.

10. The analog-digital converter according to claim 9, further comprising: a second switch for sampling the voltage of the analog input terminal selected by said channel selection means in said sampling capacitor, and
wherein said first and second switches are turned ON during the electric charge clearing period so that said digital-analog converter eliminates the residual voltage of said sampling capacitor.

11. The analog-digital converter according to claim 3, wherein the electric charge period is provided prior to a sampling period subsequent to the start of the analog-digital conversion.

12. A method for converting a data of an analog-digital converter, comprising:
- an analog-digital conversion step of performing the analog-digital conversion; and
- a residual voltage discharging step of performing the discharge of the residual voltage of the sampling capacitor at a timing at least one of prior and subsequent to said analog-digital conversing step.

13. The method for converting a data of an analog-digital converter according to claim 11, further comprising: a residual voltage setting step of setting the discharge of the residual voltage of said sampling capacitor to at least one of a zero scale voltage, a full-scale voltage and a random voltage between said zero scale voltage and said full-scale voltage.

14. A method for converting a data of an analog-digital converter, comprising:
- a first step of sampling the voltage of one analog input terminal in said sampling capacitor;
- a second step of comparing the sampled voltage with the output voltage of said digital-analog converter;
- a third step of deciding the voltage to be compared next according to the output in said second processing and performing the analog-digital conversion by repeating these operations;
- a fourth step of resetting the resister for controlling said digital-analog converter and sampling the output voltage of said digital-analog converter subsequent to the completion of the analog-digital conversion, and
- a fifth processing step of a predetermined voltage being sampled in said sampling capacitor according to the value set to said resister.

15. The method for converting a data of an analog-digital converter according to claim 14, further comprising; a sixth step of setting a predetermined voltage sampled in said sampling capacitor to at least one of a zero scale voltage, a full-scale voltage and a random voltage between said zero scale voltage and said full-scale voltage.

16. The method for converting a data of an analog-digital converter according to claim 15, wherein, in said sixth step, the voltage sampled in said sampling capacitor is set to at least one of any one of a zero scale voltage and a full-scale voltage according to the signal from the outside.

17. The method for converting a data of an analog-digital converter according to claim 14, further comprising: a seventh step of setting the voltage sampled in said sampling capacitor according to the discharge clearing data inputted from the outside at a timing subsequent to the completion of the analog-digital conversion.

* * * * *